US012014985B2

United States Patent
Kang et al.

(10) Patent No.: US 12,014,985 B2
(45) Date of Patent: *Jun. 18, 2024

(54) SEMICONDUCTOR INTERCONNECT, ELECTRODE FOR SEMICONDUCTOR DEVICE, AND METHOD OF PREPARING MULTIELEMENT COMPOUND THIN FILM

(71) Applicants: Samsung Electronics Co., Ltd., Suwon-si (KR); AJOU UNIVERSITY INDUSTRY-ACADEMIC COOPERATION FOUNDATION, Suwon-si (KR)

(72) Inventors: Youngjae Kang, Suwon-si (KR); SangWoon Lee, Suwon-si (KR); Joungeun Yoo, Seongnam-si (KR); Duseop Yoon, Seongnam-si (KR)

(73) Assignees: Samsung Electronics Co., Ltd., Gyeonggi-do (KR); AJOU UNIVERSITY INDUSTRY-ACADEMIC COOPERATION FOUNDATION, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/342,145

(22) Filed: Jun. 27, 2023

(65) Prior Publication Data

US 2023/0343709 A1    Oct. 26, 2023

Related U.S. Application Data

(63) Continuation of application No. 17/384,023, filed on Jul. 23, 2021, now Pat. No. 11,728,270.

(30) Foreign Application Priority Data

Jul. 27, 2020  (KR) .................. 10-2020-0093380
Mar. 16, 2021  (KR) .................. 10-2021-0034244

(51) Int. Cl.
  *H01L 23/532*  (2006.01)
  *H01L 21/285*  (2006.01)
  (Continued)

(52) U.S. Cl.
  CPC .... *H01L 23/53204* (2013.01); *H01L 21/2855* (2013.01); *H01L 23/5283* (2013.01); *H01L 29/45* (2013.01)

(58) Field of Classification Search
  None
  See application file for complete search history.

(56) References Cited

U.S. PATENT DOCUMENTS 7,786,393 B2  8/2010  Isberg et al.
8,440,327 B2  5/2013  Palmqvist et al.
(Continued)

FOREIGN PATENT DOCUMENTS

KR    100753120 B1    8/2007
KR    101145726 B1    5/2012

OTHER PUBLICATIONS

Daniel Gall, "Electron mean free path in elemental metals" *Journal of Applied Physics*, vol. 119, Feb. 2016, pp. 085101-1-085101-5.
(Continued)

*Primary Examiner* — Michael Lebentritt
(74) *Attorney, Agent, or Firm* — Harness, Dickey & Pierce, P.L.C.

(57) ABSTRACT

A semiconductor interconnect and an electrode for semiconductor devices may include a thin film including a multielement compound represented by Formula 1 and having a thickness equal to or less than about 50 nm, a grain size (A) to thickness (B) ratio (A/B) equal to or greater than about 1.2, and a resistivity equal to or less than about 200 μΩ·cm:

$$M_{n+1}AX_n \qquad \text{Formula 1}$$

(Continued)

In Formula 1, M, A, X, and n are as described in the specification.

30 Claims, 12 Drawing Sheets

(51) Int. Cl.
*H01L 23/528* (2006.01)
*H01L 29/45* (2006.01)

(56) References Cited

U.S. PATENT DOCUMENTS

| | | |
|---|---|---|
| 9,287,377 B2 | 3/2016 | Glaser et al. |
| 11,728,270 B2* | 8/2023 | Kang .................. H01L 23/5283 257/741 |

OTHER PUBLICATIONS

Christoph Adelmann et al., "Alternative Metals: from ab initio Screening to Calibrated Narrow Line Models" *IEEE Xplore*, 2018, pp. 154-156.

Juan M. Camacho and A.I. Oliva, "Surface and grain boundary contributions in the electrical resistivity of metallic nanofilms" *Thin Solid Films*, vol. 515, Aug. 2006, pp. 1881-1885.

Joung Eun Yoo et al., "A prospective material, MAX Phase, for overcoming scaling limitations in the resistivity of metal thin film" Samsung Best Paper Award 2020.

I. Shao et al., "An alternative low resistance MOL technology with electroplated rhodium as contact plugs for 32nm CMOS and beyond" *IEEE Xplore*, 2007, pp. 102-104.

Nicholas A. Lanzillo, "Ab Initio evaluation of electron transport properties of Pt, Rh, Ir, and Pd nanowires for advanced interconnect applications" *Journal of Applied Physics*, vol. 121, May 2017, pp. 175104-1-175104-7.

Michel W. Barsoum et al., "Layered Machinable Ceramics for High Temperature Applications" *Scripta Materialia*, vol. 36, No. 5, 1997, pp. 535-541.

Per Eklund et al., "The $M_{n+1}AX_n$ phases: Materials science and thin-film processing" *Thin Solid Films*, vol. 518, 2010, pp. 1851-1878.

J. D. Hettinger et al., "Electrical transport, thermal transport, and elastic properties of $M_2AlC$ (M=Ti, Cr, Nb, and V)" *Physical Review B*, vol. 72, 2005, pp. 115120-1-115120-6.

K. Sankaran et al., "Metallic ceramics for low resitivity interconnects: an ab initio insight" *IEEE Xplore*, 2018, pp. 160-162.

Halle Abrams, "Grain Size Measurement by the Intercept Method" *Metallography*, vol. 4, 1971, pp. 59-78.

Georg K.H. Madsen and David J. Singh, "BoltzTraP. A code for calculating band-structure dependent quantities" *Computer Physics Communications*, vol. 175, 2006, pp. 67-71.

Darwin P. Sigumonrong et al., "Interfacial structure of $V_2AlC$ thin films deposited on (1120)-sapphire" *Scripta Materialia*, vol. 64, 2011, pp. 347-350.

Darwin P. Sigumonrong et al., "Synthesis and elastic properties of $V_2AlC$ thin films by magnetron sputtering from elemental targets" *Journal of Physics D: Applied Physics*, vol. 42, 2009.

Tamer El-Raghy and Michel W. Barsoum, "Processing and Mechanical Properties of $Ti_3SiC_2$: I, Reaction Path and Microstructure Evolution" *Journal of the American Ceramic Society*, vol. 82, No. 10, 1999, pp. 2849-2854.

Tik Sun et al., "Dominant role of grain boundary scattering in the resistivity of nanometric Cu films" *Physical Review B*, vol. 79, 2009, pp. 041402-1-041402-4.

Hyejin Choi et al., "Evolution of the surface state in $Bi_2Se_2Te$ thin films during phase transition" *Nanoscale*, vol. 7, 2015, pp. 14924-14936.

Koichi Shimakawa and Safa Kasap, "Dynamics of Carrier Transport in Nanoscale Materials: Origin of Non-Drude Behavior in the Terahertz Frequency Range" *Applied Sciences*, vol. 6, No. 50, 2016.

Shibesh Dutta et al., "Thickness dependence of the resistivity of platinum-group metal thin films" *Journal of Applied Physics*, vol. 122, 2017, pp. 025107-1-025107-11.

Damir Pinek et al., "Electronic structure of $V_2AlC$" *Physical Review B*, vol. 98, 2018, pp. 035120-1-035120-9.

Y. Jiang et al., "Growth and thermal stability of $(V,Al)2Cx$ thin films" *Journal of Materials Research*, vol. 27, 2012, pp. 2511-2519.

\* cited by examiner

100nm

100nm

100nm

100nm

SEMICONDUCTOR INTERCONNECT, ELECTRODE FOR SEMICONDUCTOR DEVICE, AND METHOD OF PREPARING MULTIELEMENT COMPOUND THIN FILM

CROSS-REFERENCE TO RELATED APPLICATIONS

This application is a continuation of U.S. application Ser. No. 17/384,023, filed Jul. 23, 2021, which is based on and claims priority under 35 U.S.C. § 119 to Korean Patent Application No. 10-2020-0093380, filed on Jul. 27, 2020 in the Korean Intellectual Property Office, and Korean Patent Application No. 10-2021-0034244, filed on Mar. 16, 2021 in the Korean Intellectual Property Office, the disclosures of each of which are incorporated by reference herein in their entirety.

BACKGROUND

1. Field

The present inventive concepts relate to semiconductor interconnects, electrodes for semiconductor devices, and methods of preparing multielement compound thin films.

2. Description of the Related Art

With the development of compact and high-performance electronic devices in recent years, there is an increasing demand for compact and high-performance semiconductor devices used in various electronic circuits. As sizes of semiconductor devices decrease, interconnects or electrode materials included therein have also become thinner and resistivity thereof is rapidly increasing. Cu materials, generally used in the art, are limited in barrier formation or liner scaling. Although attempts have been made to use Ru, Ir, and Co materials to replace the Cu materials, there are price issues and it is difficult to keep the balance of demand and supply of raw materials.

SUMMARY

Provided are semiconductor interconnects having a low resistivity at a thickness of 50 nm or less.

Provided are electrodes for semiconductor devices having a low resistivity at a thickness of 50 nm or less.

Such semiconductor interconnects and/or electrodes may include a including a particular material having low resistivity even at a small thickness of 50 nm or less.

Provided are methods of preparing a multielement compound thin film having excellent interconnecting reliability and a low resistivity.

Additional aspects will be set forth in part in the description which follows and, in part, will be apparent from the description, or may be learned by practice of the presented embodiments of the inventive concepts.

According to an aspect of some example embodiments, a semiconductor interconnect includes a thin film comprising a multielement compound represented by Formula 1 below:
wherein the thin film a thickness equal to or less than about 50 nm, a grain size (A) to thickness (B) ratio (A/B) equal to or greater than about 1.2, and a resistivity equal to or less than about 200 μΩ·cm.

$$M_{n+1}AX_n \quad \text{Formula 1}$$

In Formula 1,
M includes at least one transition metal selected from elements of periodic table groups 3, 4, 5, and 6,
A includes at least one element selected from elements of periodic table groups 12, 13, 14, 15, and 16,
X is carbon (C), nitrogen (N), or any combination thereof, and
n is 1, 2, or 3.

The grain size (A) may be equal to or greater than about 65 nm.

The thickness may be in a range of about 0.1 nm to about 50 nm.

The multielement compound may include at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$.

The thin film may be an epitaxially grown deposited film.

The thin film may have a layered structure aligned in an in-plane direction.

The semiconductor interconnect may further include a seed layer or a liner layer on one surface of the thin film.

The seed layer or liner layer may include TiC, TiN, TaC, TaN, VC, VN, or any combination thereof.

An electronic device may include the semiconductor interconnect.

According to an aspect of some example embodiments, an electrode for a semiconductor device includes a thin film including a multielement compound represented by Formula 1 below:
wherein the thin film has a thickness equal to or less than about 50 nm, a grain size (A) to thickness (B) ratio (A/B) equal to or greater than about 1.2, and a resistivity equal to or less than about 200 μΩ·cm.

$$M_{n+1}AX_n \quad \text{Formula 1}$$

In Formula 1,
M includes at least one transition metal selected from elements of periodic table groups 3, 4, 5, and 6,
A includes at least one element selected from elements of periodic table groups 12, 13, 14, 15, and 16,
X is carbon (C), nitrogen (N), or any combination thereof, and
N is 1, 2, or 3.

The electrode may include a capacitor electrode or a transistor electrode.

An electronic device may include the electrode.

According to an aspect of some example embodiments, a method of preparing a multielement compound thin film, the method includes
preparing a substrate; and
forming a multielement compound thin film represented by Formula 1 below and epitaxially grown on one surface of the substrate by deposition,
wherein the multielement compound thin film has a thickness equal to or less than about 50 nm, and a grain size (A) to thickness (B) ratio (A/B) equal to or greater than about 1.2, and a resistivity equal to or less than about 200 μΩ·cm:

$$M_{n+1}AX_n \quad \text{Formula 1}$$

In Formula 1,
M includes at least one transition metal selected from elements of periodic table groups 3, 4, 5, and 6,
A includes at least one element selected from elements of periodic table groups 12, 13, 14, 15, and 16,
X may be carbon (C), nitrogen (N), or any combination thereof, and
n may be 1, 2, or 3.

The deposition may include direct current (DC) sputtering, radio frequency (RF) sputtering, or any combination thereof.

The deposition may be performed at a temperature of 650° C. to 800° C.

The method may include incorporating the multielement compound thin film in a semiconductor interconnect or an electrode for semiconductor devices.

The method may further include forming a barrier layer on the multielement compound thin film after forming the multielement compound thin film.

The method may further include forming an electronic device that includes the multielement compound thin film.

According to some example embodiments, a device may include a thin film that includes a multielement compound represented by Formula 1, wherein the thin film has a thickness between about 6 nm and about 42 nm and a resistivity between about 40 μΩ·cm to about 50 μΩ·cm,

$$M_{n+1}AX_n \qquad \text{Formula 1}$$

wherein in Formula 1,
M includes at least one transition metal selected from elements of periodic table groups 3, 4, 5, and 6,
A includes at least one element selected from elements of periodic table groups 12, 13, 14, 15, and 16,
X is carbon (C), nitrogen (N), or any combination thereof, and
n is 1, 2, or 3.

The thin film may have a grain size (A) to thickness (B) ratio (A/B) equal to or greater than about 1.2.

The device may be a semiconductor interconnect or an electrode for a semiconductor device.

An electronic device may include the device.

BRIEF DESCRIPTION OF THE DRAWINGS

The above and other aspects, features, and advantages of certain example embodiments of the inventive concepts will be more apparent from the following description taken in conjunction with the accompanying drawings, in which.

DETAILED DESCRIPTION

Figure 1:
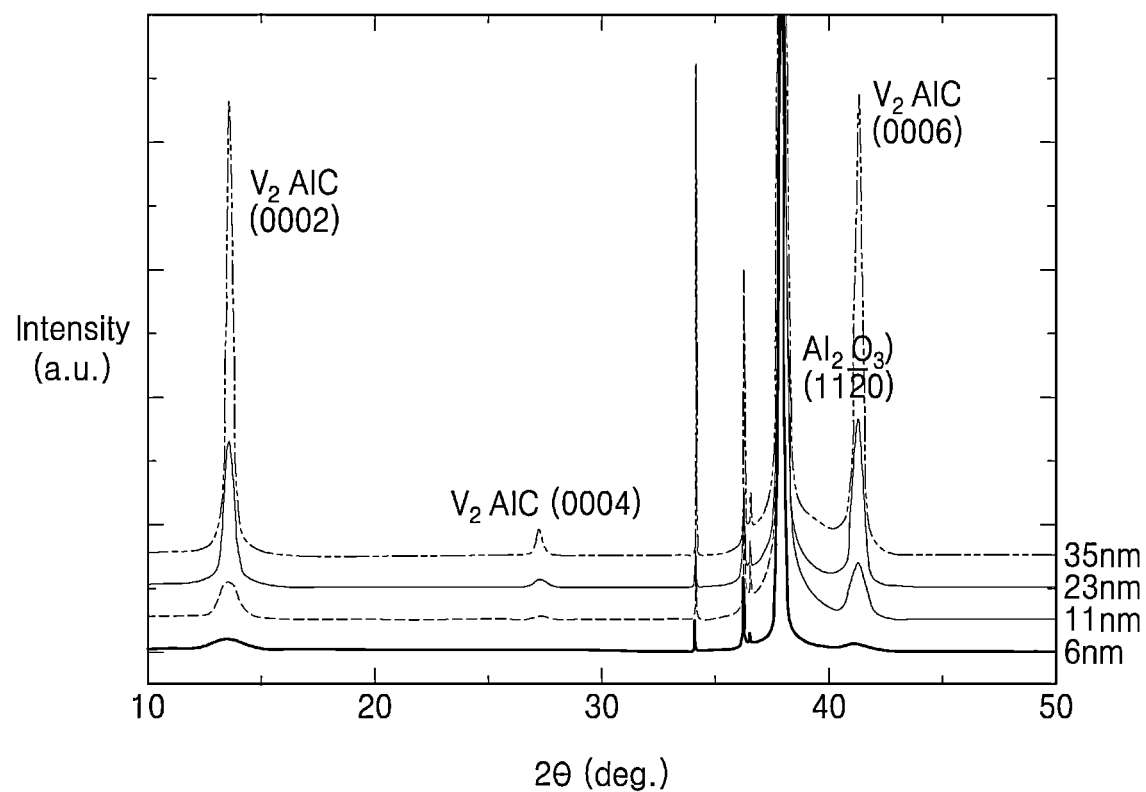
FIG. 1 is a graph illustrating X-ray diffraction (XRD) analysis results of a $V_2AlC$ thin films according to Example 1 prepared to have thicknesses of 6 nm, 11 nm, 23 nm, and 35 nm according to some example embodiments.

Reference will now be made in detail to some example embodiments, examples of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, semiconductor interconnects, electrodes for semiconductor devices, and methods of preparing a multielement compound thin film according to some example embodiments of the present inventive concepts will be described in detail with reference to the accompanying drawings. The following descriptions are for the purpose of describing particular embodiments and the present inventive concepts is not limited thereby. The present inventive concepts are only defined by the scope of claims below.

It will be understood that when an element such as a layer, film, region, or substrate is referred to as being "on" another element, it may be directly on the other element or intervening elements may also be present (e.g., the element may be isolated from direct contact with the other element). In contrast, when an element is referred to as being "directly on" another element, there are no intervening elements present. It will be understood that when an element such as a layer, film, region, or substrate is referred to as being "on" another element, it may be above or under the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

An expression used in the singular encompasses the expression of the plural, unless otherwise indicated or it has a clearly different meaning in the context. Also, throughout the specification, the term "include" or "have" is intended to indicate that an element does not preclude the other elements but further add another element, unless otherwise stated.

As used herein, the term "combination" includes a mixture, an alloy, a reaction product, and the like unless otherwise stated.

The term "or" refers to "and/or", unless otherwise stated. As used herein, the terms "an embodiment", "embodiments", "some example embodiments," and the like indicate that elements described with regard to some example embodiments are included in at least one embodiment described in this specification and may or may not present in other embodiments. In addition, it may be understood that the described elements are combined in any suitable manner in various embodiments. Unless otherwise defined, all terms including technical and scientific terms used herein have the same meaning as commonly understood by one of ordinary skill in the art to which the inventive concepts belong. All patents, patent applications, and other cited references are incorporated herein by reference in their entirety. However, in the event of any conflict or inconsistency between terms used herein and terms of the cited references, the terms used in this specification take precedence over the terms of the cited references. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modification, variations, improvements, and substantial equivalents.

Due to electrical conductivity higher than aluminum (Al) by about 30% or more and electro-migration (EM) properties, crucially affecting decreases in lifespan of semiconductor devices, improved up to 10 times, copper (Cu) has been widely used as wiring materials. However, as semiconductor devices are highly integrated and have high performance, line width of interconnects gradually become narrower and the amount of current in actual chip interconnects considerably increases due to the high performance. As a result, current density applied to metal interconnects more increases and thus electrical and mechanical stress applied to interconnects material rapidly increases, causing a problem in reliability of the interconnects. Also, there is a need to develop a reliable material for electrodes capable of reducing or minimizing a phenomenon of an increase in resistivity caused by a decreased size of a device. Research on an alternative material has been attempted to solve the reliability problem and reduce the increase in resistivity caused by a decreased size of an interconnect pattern or an electrode.

Figure 5A:
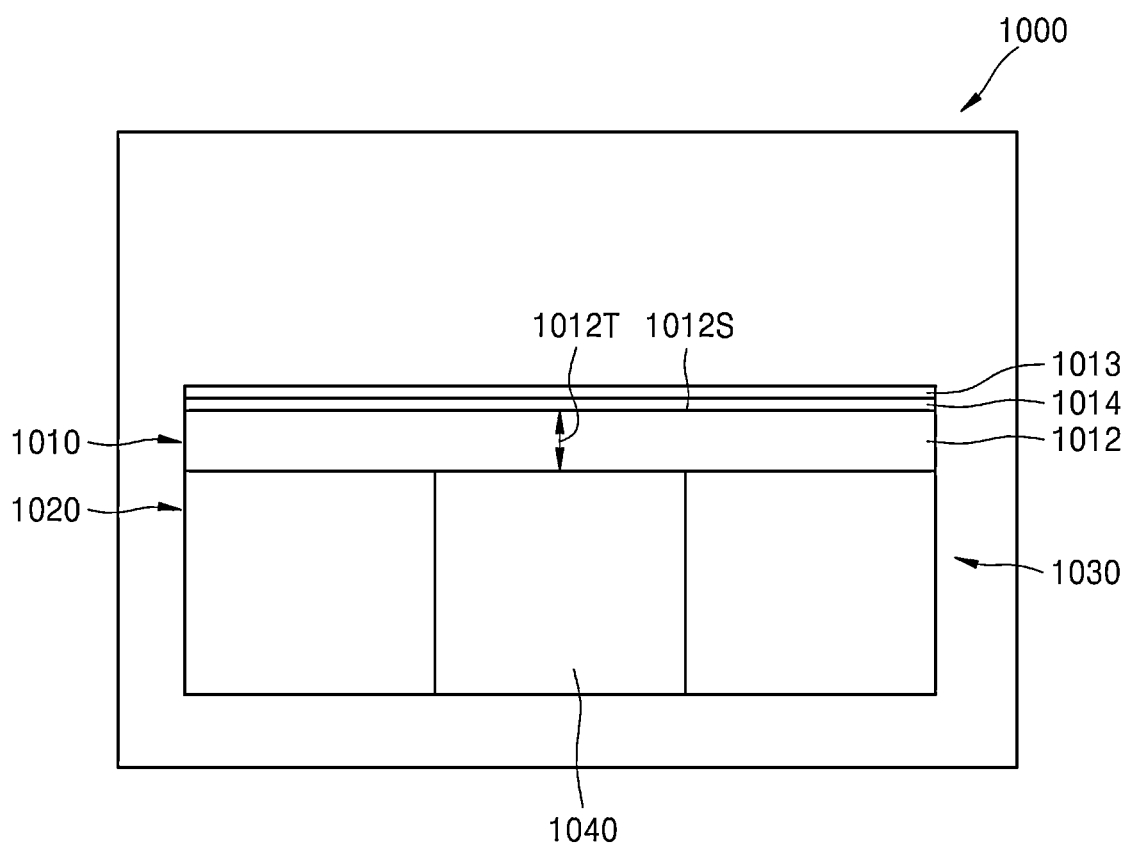
FIG. 5A illustrates a semiconductor device including a semiconductor interconnect according to some example embodiments.

FIG. 5A illustrates a semiconductor device 1000 including a semiconductor interconnect 1010 according to some example embodiments. As shown in FIG. 5A, a semiconductor device 1000 may include two or more semiconductor device components 1020 and 1030 and a semiconductor interconnect 1010 configured to electrically connect the semiconductor device components 1020 and 1030 together. The semiconductor device components 1020 and 1030 may include separate circuits, conductive layers, contacts, electrodes, wires, or the like of a semiconductor device. For example, the semiconductor device components 1020 may be conductive layers each comprising a conductive material (e.g., copper). As described herein, a semiconductor device 1000 may include a transistor, such as a metal-oxide-semiconductor field effect transistor (MOSFET), and the semiconductor device components 1020 and 1030 as described herein may include, for example, structures of a transistor, such as gate, body, source, and/or drain terminals of a MOSFET.

Referring to FIG. 5A, a semiconductor interconnect 1010 according to some example embodiments may include a thin film 1012 including a multielement compound represented by Formula 1 below, wherein the thin film 1012 has a thickness 1012T (e.g., a thickness between opposite surfaces of the thin film 1012 in a direction perpendicular to said surfaces and to an in-plane direction of the thin film 1012) equal to or less than about 50 nm, a grain size (A) to thickness (B) ratio (A/B) equal to or greater than about 1.2, and a resistivity equal to or less than about 200 μΩ·cm:

$$M_{n+1}AX_n \quad \text{Formula 1}$$

In Formula 1,

M includes at least one transition metal selected from elements of groups 3, 4, 5, and 6 of the periodic table (e.g., at least one transition metal of the elements of periodic table groups 3, 4, 5, and 6), A includes at least one element selected from elements of groups 12, 13, 14, 15, and 16 of the periodic table (e.g., at least one element of the elements of periodic table groups 12, 13, 14, 15, and 16), X is carbon (C), nitrogen (N), or any combination thereof, and n is 1, 2, or 3.

As described herein, a group of the periodic table may be referred to interchangeably as a "periodic table group"

Resistivity of the thin film 1012 is higher than that of bulk resistance. According to an equation by Fuchs-Sondheimer & Mayadas-Shatzkes, as the thickness 1012T of the thin film 1012 decreases, the resistivity of the thin film 1012 is affected more by surface scattering and grain boundary scattering. Among them, in the case of the grain boundary scattering, as the grain size decreases, the resistivity increases.

The semiconductor interconnect 1010 according to some example embodiments includes a thin film 1012 having a high grain size (A) to thickness (B) ratio (A/B) of about 1.2 or more (e.g., equal to or greater than about 1.2) and a thickness 1012T of about 50 nm or less (e.g., equal to or less than about 50 nm). For example, the grain size (A) may be about 65 nm or more, about 66 nm or more, or about 67 nm or more. The ratio (A/B) may be about 100 or less, about 50 or less, about 10 or less, about 5 or less, about 2 or less, or about 1.5 or less. The grain size (A) may be about 1000 nm or less, about 500 nm or less, about 100 nm or less, about 80 nm or less, about 70 nm or less, or the like. For example, the thickness 1012T may be in a range of about 0.1 nm to about 50 nm, about 0.5 nm to about 50 nm, or about 1 nm to about 50 nm. The resistivity of the semiconductor interconnect may be about 200 μΩ·cm or less (e.g., equal to or less than about 200 μΩ·cm, between about 0.1 μΩ·cm and about 200 μΩ·cm).

The semiconductor interconnect 1010 according to some example embodiments may include the multielement compound represented by Formula 1. The multielement compound may be a crystalline substance in which MX with quasi-ceramic properties is combined with a metal element A different from M. Because the multielement compound has a high melting point and high cohesive energy, reliability thereof as a material of semiconductor interconnects is excellent, and thus a reliability of the semiconductor device 1000 and/or an electronic device including the semiconductor device 1000 may be improved based on including the semiconductor interconnect 1010. The multielement compound may have oxidation resistance when a protective film including oxides of element A and/or element B is formed. The multielement compound has a low resistivity and high thermal stability.

The multielement compound may include at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$. For example, the multielement compound may include at least one selected from $V_2AlC$, $V_2GaC$, $V_2GeC$, $V_2AsC$, $V_2GaN$, $V_2PC$, $V_3AlC_2$, and $V_4AlC_3$. For example, the multielement compound may be $V_2AlC$.

The thin film 1012 may be an epitaxially grown deposited film. The thin film 1012 may be a deposited film epitaxially grown on a substrate in a process chamber (e.g., of system 1301 as described herein with reference to at least FIGS. 6-7) in the c-direction without an additional buffer layer.

The thin film 1012 may have a layered structure aligned in an in-plane direction; for example, the thin film 1012 may comprise a stack of layers overlapping each other in a direction extending perpendicular to in-plane directions of the layers of the stack. The thin film 1012 may have a high electrical conductivity.

The semiconductor interconnect 1010 may further include a seed layer or liner layer 1014 on one surface 1012S of the thin film 1012. The seed layer or liner layer 1014 may increase adhesive strength between the thin film 1012 and the substrate or optionally between the thin film 1012 and a barrier layer 1013. For example, the seed layer or liner layer 1014 may include TiC, TiN, TaC, TaN, VC, VN, or any combination thereof.

The semiconductor interconnect 1010 may be used in a wire electrically connecting one component (e.g., semiconductor device component 1020) to another component (e.g., semiconductor device component 1030) inside a semiconductor device 1000. As shown in FIG. 5A, for example, the semiconductor interconnect 1010 may be in the form of a thin film extending directly on respective top surfaces of the semiconductor device components 1020 and 1030, which may be physically and electrically isolated from each other via an insulation layer or structure 1040 (e.g., silicon dioxide) so that the semiconductor interconnect 1010 may electrically connect the semiconductor device components 1020 and 1030 to each other. The semiconductor interconnect 1010 may be used in a via vertically located for electrical connection between the respective layers. The semiconductor interconnect 1010 may be in the form of a thin film having a thickness of about 50 nm or less, for example, about 40 nm or less, about 30 nm or less, about 20 nm or less, or about 10 nm or less. The semiconductor interconnect 1010 may be in the form of a thin film having a thickness of about 0.1 nm or more, for example about 0.5 nm or more, about 1 nm or more, about 2 nm or more, or about 5 nm or more.

Figure 5B:
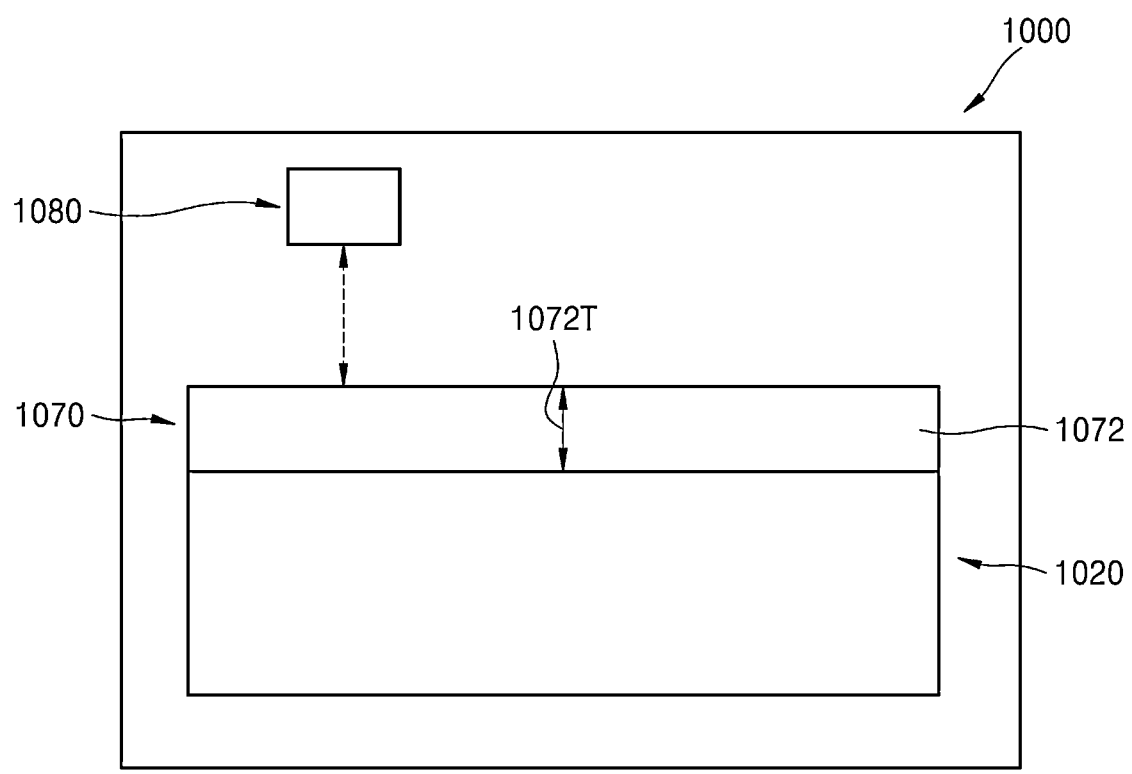
FIG. 5B illustrates a semiconductor device including an electrode according to some example embodiments.

FIG. 5B illustrates a semiconductor device 1000 including an electrode 1070 according to some example embodiments. As shown in FIG. 5B, a semiconductor device 1000 may include at least one semiconductor device component 1020, a power source or output 1080 (e.g., a voltage source, such as an AC or DC power source, a voltage drain, an electrical ground, or the like), and an electrode 1070 electrically connected therebetween.

Referring to FIG. 5B, an electrode 1070 for semiconductor devices according to some example embodiments may include a thin film 1072 including a multielement compound represented by Formula 1 below, the thin film having a thickness 1072T (e.g., a thickness between opposite surfaces of the thin film 1072 in a direction perpendicular to said surfaces and to an in-plane direction of the thin film 1072)

equal to or less than about 50 nm, a grain size (A) to thickness (B) ratio (A/B) equal to or greater than about 1.2, and a resistivity equal to or less than about 200 μΩ·cm:

$$M_{n+1}AX_n \quad \text{Formula 1}$$

In Formula 1,

M includes at least one transition metal selected from elements of groups 3, 4, 5, and 6 of the periodic table (e.g., at least one transition metal of the elements of periodic table groups 3, 4, 5, and 6), A includes at least one element selected from elements of groups 12, 13, 14, 15, and 16 of the periodic table (e.g., at least one element of the elements of periodic table groups 12, 13, 14, 15, and 16), X is carbon (C), nitrogen (N), or any combination thereof, and n is 1, 2, or 3.

The electrode 1070 for semiconductor devices may be used in (e.g., included in) small-sized semiconductor devices 1000. The electrode 1070 for semiconductor devices may have a reduced or minimized increase in resistivity and excellent electrical reliability, thereby improving reliability of the semiconductor devices that include the electrode 1070.

The electrode for semiconductor devices according to some example embodiments includes a thin film having a high grain size (A) to thickness (B) ratio (A/B) of about 1.2 or more and a thickness of about 50 nm or less. For example, the grain size (A) may be about 65 nm or more, about 66 nm or more, or about 67 nm or more. The ratio (A/B) may be about 100 or less, about 50 or less, about 10 or less, about 5 or less, about 2 or less, or about 1.5 or less. The grain size (A) may be about 1000 nm or less, about 500 nm or less, about 100 nm or less, about 80 nm or less, about 70 nm or less, or the like. For example, the thickness 1072T may be in a range of about 0.1 nm to about 50 nm, about 0.5 nm to about 50 nm, or about 1 nm to about 50 nm. The semiconductor electrode may have a resistivity of 200 μΩ·cm or less (e.g., equal to or less than about 200 μΩ·cm).

The electrode 1070 according to some example embodiments may include a multielement compound represented by Formula 1. The multielement compound is a crystalline substance in which MX with quasi-ceramic properties is combined with a metal element A different from M. The multielement compound has a high melting point and high cohesive energy, thereby having excellent reliability as a material of semiconductor electrodes. The multielement compound may have oxidation resistance when a protective film including oxides of element A and/or element B is formed. The multielement compound has a low resistivity and high thermal stability, and thus a thermal stability and reliability of the semiconductor device 1000 may be improved based on including the electrode 1070.

The multielement compound may include at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$. For example, the multielement compound may include at least one selected from $V_2AlC$, $V_2GaC$, $V_2GeC$, $V_2AsC$, $V_2GaN$, $V_2PC$, $V_3AlC_2$, and $V_4AlC_3$. For example, the multielement compound may be $V_2AlC$.

The thin film 1072 may be an epitaxially grown deposited film. The thin film 1072 may be a deposited film epitaxially grown on a substrate in a process chamber (e.g., of system 1301 as described herein with reference to at least FIG. 7) in the c-direction without an additional buffer layer.

The thin film 1072 may have a layered structure aligned in an in-plane direction; for example, the thin film 1072 may comprise a stack of layers overlapping each other in a direction extending perpendicular to in-plane directions of the layers of the stack. The thin film 1072 may have a high electrical conductivity.

The electrode 1070 may include a capacitor electrode or a transistor electrode.

Figure 6:
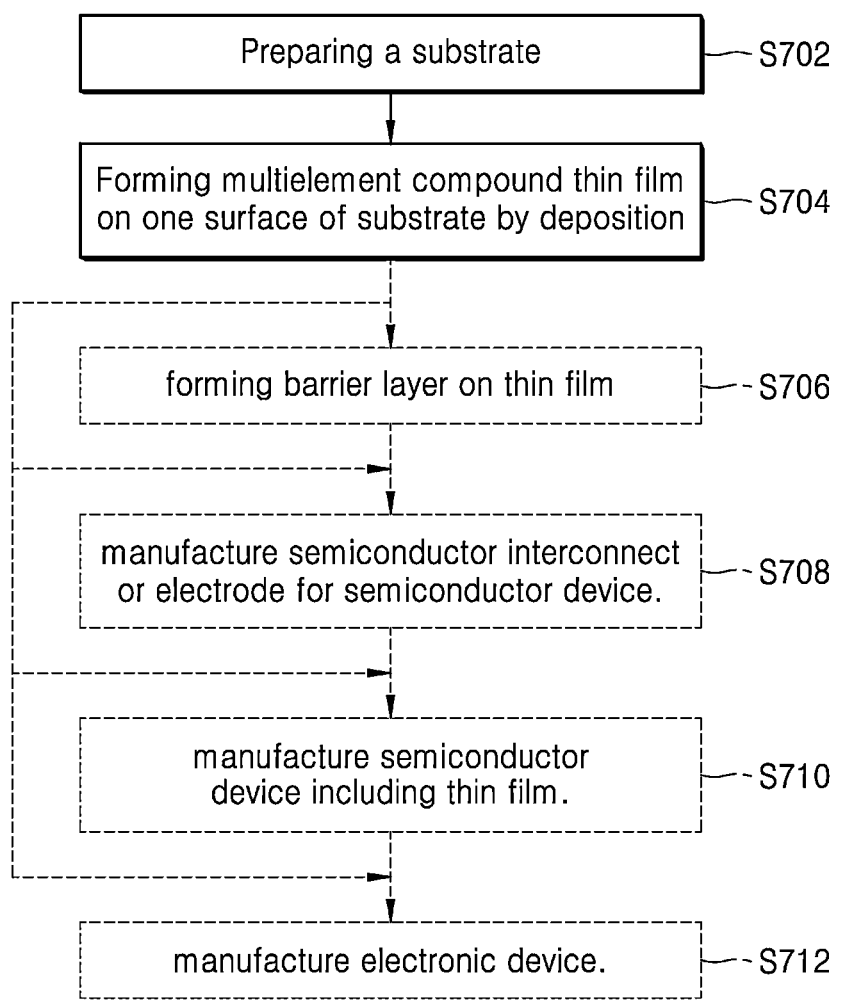
FIG. 6 is a flowchart showing a method according to some example embodiments.
Figure 7:
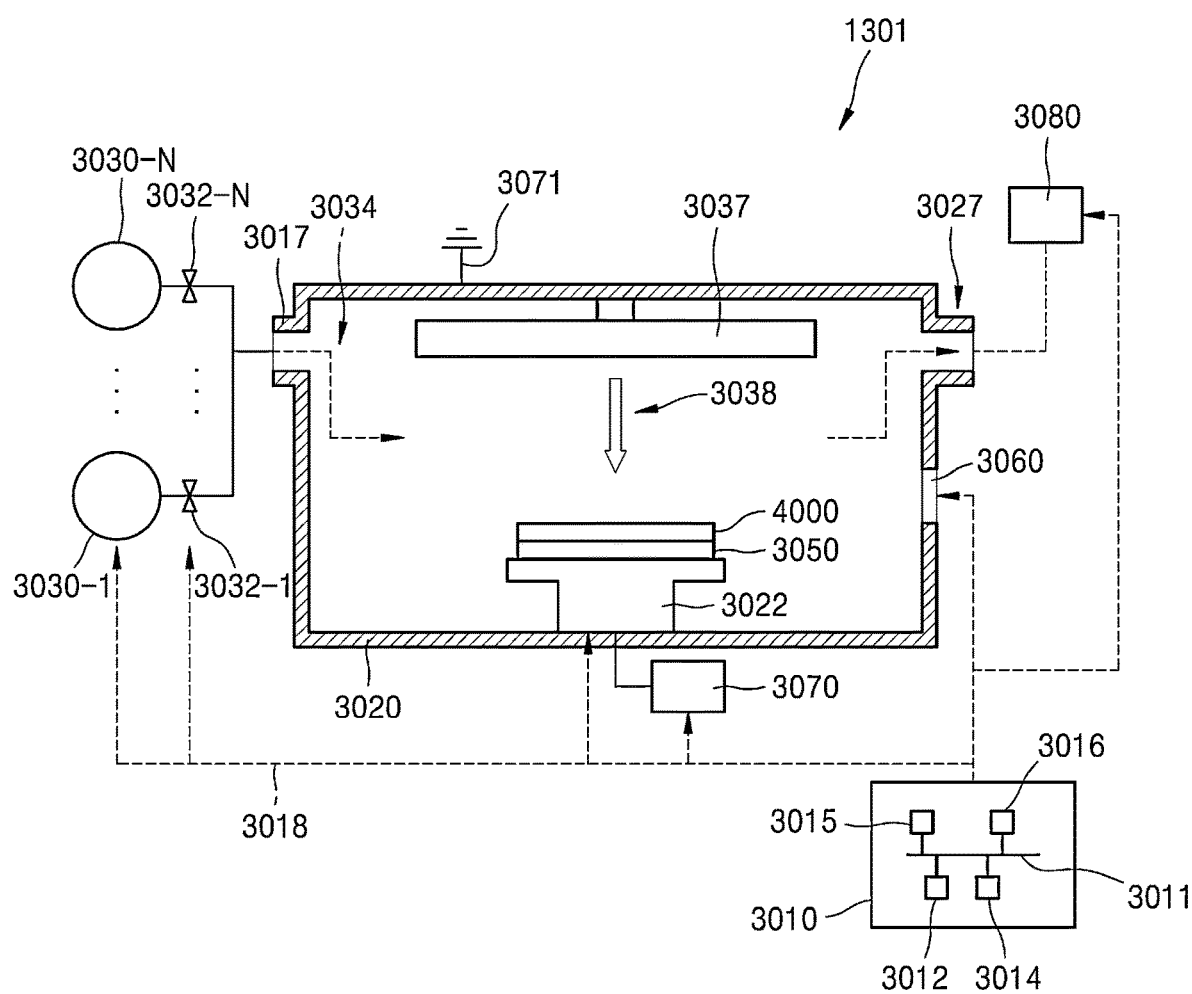
FIG. 7 shows a schematic of a system according to some example embodiments.
Figure 8:
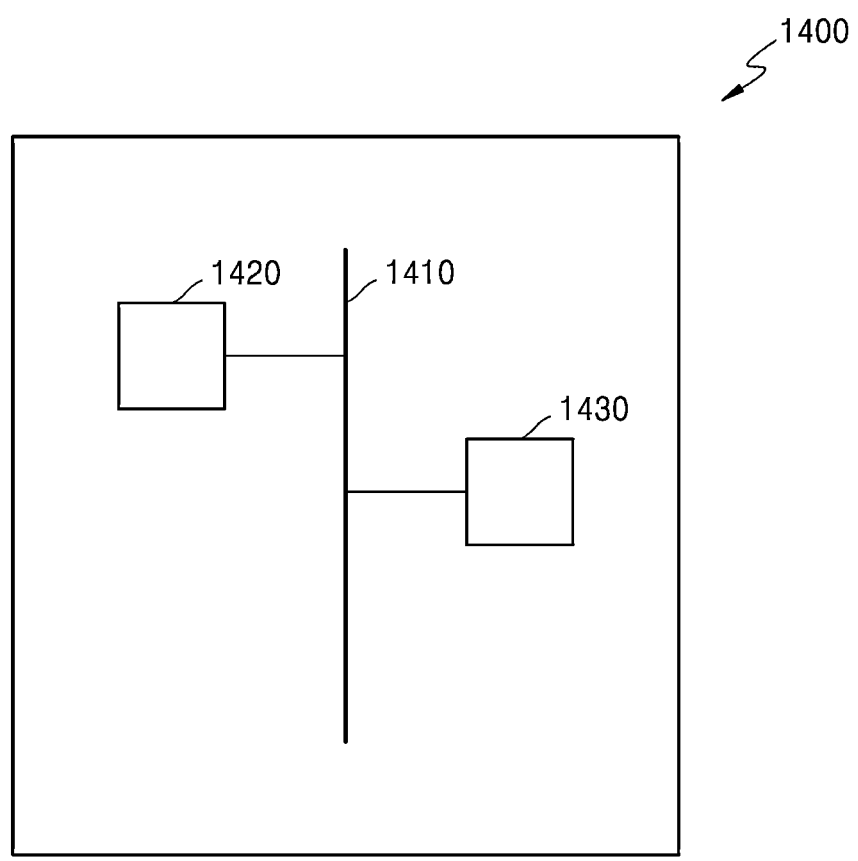
FIG. 8 shows a schematic of an electronic device according to some example embodiments.
Figure 9:
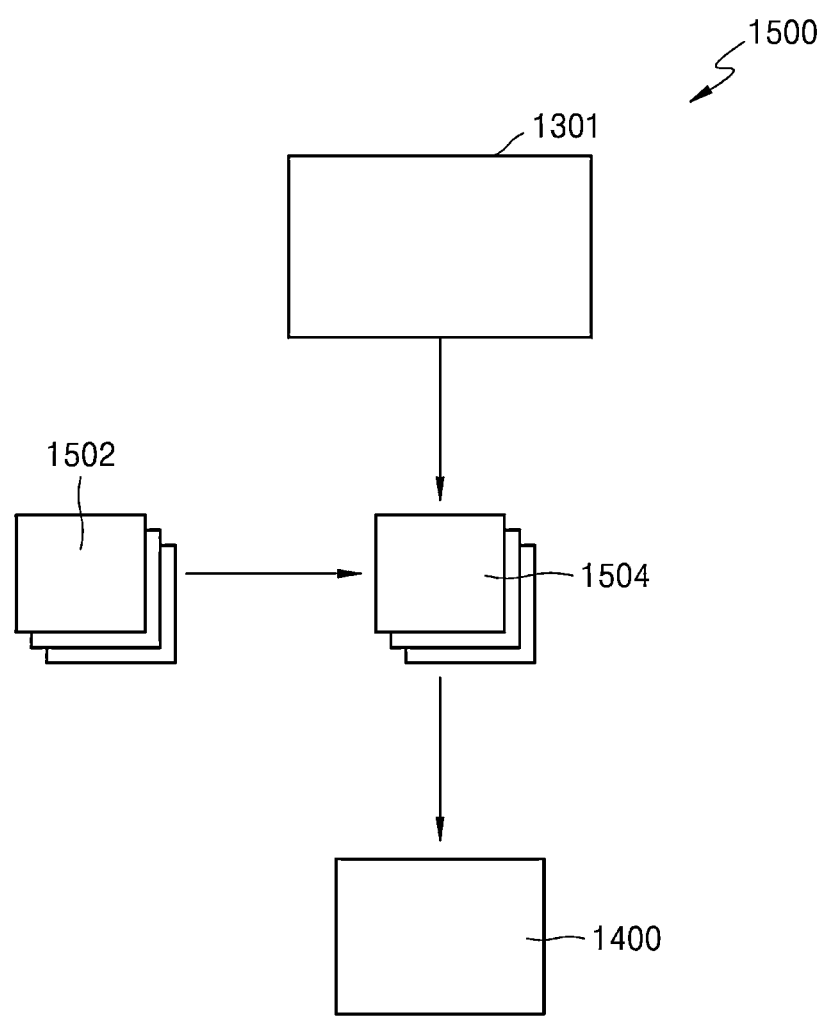
FIG. 9 shows a schematic of a system according to some example embodiments.

FIG. 6 is a flowchart showing a method according to some example embodiments. FIG. 7 shows a schematic of a system 1301 configured to control the preparation (also referred to herein interchangeably as "fabrication" or "manufacturing") of a multielement compound thin film according to some example embodiments. FIG. 8 shows a schematic of an electronic device according to some example embodiments. FIG. 9 shows a schematic of a system 1500 configured to control the formation of an electronic device (e.g., "computing device") according to some example embodiments.

Referring to FIG. 7, system 1301 includes a computing device 3010 (also referred to herein interchangeably as an electronic device), composition (e.g., gas, fluid, etc.) sources 3030-1 to 3030-N and control devices 3032-1 to 3032-N (where N is a positive integer), a heat source 3060, and/or a process chamber 3020.

Referring first to the computing device 3010, the computing device 3010 may include processing circuitry 3012 (also referred to herein as simply a processor), memory 3014, a power supply 3015, and a communication interface 3016 that are communicatively and/or electrically coupled together via a bus 3011.

The computing device 3010 may be included in one or more various electronic devices, including, for example, a mobile phone, a digital camera, a sensor device, or the like. In some example embodiments, the computing device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like. The computing device 3010 may be referred to herein as simply "processing circuitry."

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

The processing circuitry 3012 may execute a program and control one or more aspects of the system 1301, via the communication interface 3016 as shown in FIG. 7. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIG. 6 and/or any method for forming (e.g., "fabricating," "manufacturing," etc.) any multielement compound thin film, any semiconductor interconnect, any electrode for semiconductor devices, any semiconductor devices, and/or any electronic devices according to any of the example embodiments.

In some example embodiments, the communication interface 3016 may include a USB and/or HDMI interface. In some example embodiments, the communication interface 3016 may include a wireless communication interface.

Still referring to FIG. 7, the process chamber 3020 may include a pedestal and/or chuck 3022 that is configured to structurally support a substrate 3050 upon which device 4000 (which may be any of the example embodiments of multielement compound thin films, semiconductor interconnects, electrodes, semiconductor devices, or the like according to any of the example embodiments described herein) according to any of the example embodiments may be prepared (e.g., "fabricated," "manufactured," etc.). As shown, the pedestal and/or chuck 3022 may be coupled to a motor such that the computing device 3010 (e.g., "processing circuitry") may be configured to cause the pedestal and/or chuck 3022 to move, via control signals communicated from communication interface 3016, for example to enable the substrate 3050 and/or device 4000 to be moved within, into, and/or out of the process chamber 3020.

Still referring to FIG. 7, the system 1301 includes one or more composition sources 3030-1 to 3030-N(N being a positive integer) which may store various materials, including any materials, compounds, substances, dopants, and/or compositions described herein, or any combination thereof, as described herein. The materials may be stored as a gas, as a liquid, as a solid, as any type of fluid, or any combination thereof. As shown, each separate composition source is coupled to the process chamber 3020 via a separate supply control device 3032-1 to 3032-N (e.g., control valve), where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by computing device 3010 (e.g., "processing circuitry").

Still referring to FIG. 7, system 1301 includes a sputtering target 3037 that may include any materials, compounds, substances, dopants, and/or compositions described herein, or any combination thereof, as described herein. The sputtering target 3037 may be used as a target of a deposition process (e.g., DC sputtering and/or RF sputtering) to deposit a material from the sputtering target 3037 to the substrate 3050 and/or a portion of device 4000 thereon according to any deposition process.

Still referring to FIG. 7, system 1301 includes a power supply 3070 (e.g., voltage source, DC power supply, RF power supply, magnetron, or the like) and may include an electrical ground 3071 coupled to the process chamber 3020. During a sputtering process, the power supply 3070 (alone or in combination with electrical ground 3071) may enable a DC or RF sputtering process to occur. As shown, the power supply 3070 may be controlled by the computing device 3010 (e.g., "processing circuitry").

Still referring to FIG. 7, system 1301 includes a heat source 3060, which may be a heating device, heating element, heater, or the like that may be utilized to generate heat and provide the generated heat to the process chamber 3020 (e.g., to heat at least a portion of the process chamber 3020), for example causing a temperature in the process chamber to be at a certain temperature or range of temperatures as described herein. As shown, the heat source 3060 may be controlled by the computing device 3010 (e.g., "processing circuitry").

Still referring to FIG. 7, system 1301 may include a vacuum pump 3080 that is coupled to the outlet 3027 of the process chamber 3020, and the one or more composition sources 3030-1 to 3030-N may be coupled, via respective control devices 3032-1 to 3032-N, to the inlet 3017 of the process chamber 3020. The vacuum pump 3080 may be operated to establish a pressure gradient in the process chamber between inlet 3017 and outlet 3027 to enable fluid (e.g., gas) flow from the composition sources 3030-1 to 3030-N and the outlet 3027. The vacuum pump 3080 may be operated to establish a vacuum, near-vacuum, and/or controlled (e.g., reduced) pressure within the process chamber 3020. In some example embodiments, the process chamber 3020 may be referred to as a vacuum chamber. As shown, the vacuum pump 3080 may be controlled by the computing device 3010 (e.g., "processing circuitry").

As shown in FIG. 7, the computing device 3010 (e.g., "processing circuitry") may, for example based on processing circuitry 3012 executing a program of instruction stored on memory 3014, communicate with various elements of the system 1301 via communication lines 3018 to cause the system 1301 to prepare a multielement compound thin film, a semiconductor interconnect including a multielement compound thin film, an electrode including a multielement compound thin film, a semiconductor device including a multielement compound thin film, or the like according to any example embodiments herein (e.g., perform a method including any of the methods described herein). It will be understood that the system 1301 may omit one or more of the elements shown in FIG. 7 (e.g., the heat source 3060, the pedestal or chuck 3022, or the like).

Referring to FIGS. 6-7, a method of preparing a multielement compound thin film (e.g., device 4000 that includes a multielement compound thin film according to any of the example embodiments) according to some example embodiments includes: preparing a substrate (e.g., 3050) (S702); and forming a multielement compound thin film represented by Formula 1 below (e.g., 1012 or 1072, which may partially or entirely comprise device 4000) and epitaxially grown on (e.g., directly on) one surface of the substrate (e.g., 3050) by deposition (S704), wherein the multielement compound thin film has a thickness (e.g., in a direction perpendicular to the one surface of the substrate) equal to or less than about 50 nm, and a grain size (A) to thickness (B) ratio (A/B) equal to or greater than about 1.2, and a resistivity equal to or less than about 200 μΩ·cm:

$$M_{n+1}AX_n \qquad \text{Formula 1}$$

In Formula 1,

M includes at least one transition metal selected from elements of groups 3, 4, 5, and 6 of the periodic table (e.g., elements of periodic table groups 3, 4, 5, and 6), A includes at least one element selected from elements of groups 12, 13, 14, 15, and 16 of the periodic table (e.g., selected from elements of periodic table groups 12, 13, 14, 15, and 16), X is carbon (C), nitrogen (N), or any combination thereof, and n is 1, 2, or 3.

The deposition at S704 may include direct current (DC) sputtering, radio frequency (RF) sputtering (e.g., based on controlling power supply 3070, composition sources 3030-1 to 3030-N, control devices 3032-1 to 3032-N, heat source 3060, pedestal and/or chuck 3022, vacuum pump 3080, or the like), or any combination thereof. The deposition may be performed at a process chamber 3020 temperature (e.g., based on controlling the heat source 3060) of about 650° C. to about 800° C. The deposition at S704 may include controlling vacuum pump 3080 and one or more control devices 3032-1 to 3032-N to cause a flow 3034 of a composition (e.g., gas) from one or more of the composition sources 3030-1 to 3030-N to the process chamber 3020 via the inlet 3017 and through the process chamber 3020 to outlet 3027. The deposition at S704 may include the vacuum pump 3080 operating to establish a vacuum, near-vacuum, and/or controlled (e.g., reduced) pressure within the process chamber 3020. The deposition at S704 may include the power supply 3070 operating to enable DC sputtering or RF sputtering of a material 3038 from sputtering target 3037 to the substrate 3050 or a part of a device 400 already on the substrate 3050. A device 4000 that includes or is a uniform and continuous thin film (e.g., thin film 1012 or 1072) may be formed by epitaxially growing the thin film on one surface of the substrate 3050 via deposition by using the sputtering as described above. The formed thin film of device 4000 may include polygonal anisotropic grains such as hexagonal shapes. Because polygonal anisotropic grains have high surface energy, large-sized grains may be grown in an in-plane direction. Also, a cubic phase, e.g., a cubic carbide phase, which inhibits grain growth by the pinning effect at grain boundaries, may be reduced or minimized. Thus, a thin film 1012 having a low resistivity may be prepared without breaking down a phase caused by the large grain size by adjusting crystallinity by the deposition.

For example, the grain size (A) may be about 65 nm or more, about 66 nm or more, or about 67 nm or more. The grain size (A) may be about 1000 nm or less, about 500 nm or less, about 100 nm or less, about 80 nm or less, about 70 nm or less, or the like. For example, the thickness may be in a range of about 0.1 nm to about 50 nm, about 0.5 nm to about 50 nm, or about 1 nm to about 50 nm. In some example embodiments, the multielement compound thin film according to any of the example embodiments may have a thickness greater than about 50 nm, a grain size (A) less than about 65 nm, and/or a grain size (A) to thickness (B) ratio (A/B) less than about 1.2.

The multielement compound may include at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$. For example, the multielement compound may include at least one selected from $V_2AlC$, $V_2GaC$, $V_2GeC$, $V_2AsC$, $V_2GaN$, $V_2PC$, $V_3AlC_2$, and $V_4AlC_3$. For example, the multielement compound may be $V_2AlC$. Due to a low resistivity and high thermal stability, the multielement compound may be used in semiconductor interconnects or electrodes for semiconductor devices.

The multielement compound thin film may have a layered structure aligned in an in-plane direction; for example, the thin film may comprise a stack of layers overlapping each other in a direction extending perpendicular to in-plane directions of the layers of the stack.

The method may further include forming a barrier layer on the multielement compound thin film (e.g., on device 4000 that is the multielement compound thin film) at S706 after forming the multielement compound thin film at S704. The barrier layer may be, for example, an undoped Si film, formed based on depositing Si on the device 4000 (which may be the multielement compound thin film according to any of the example embodiments). The barrier layer may have a thickness of 3 nm or less.

Referring now to FIG. 8, an electronic device 1400 may include one or more electronic device components, including a processor (e.g., processing circuitry) 1420 and a memory 1430 that are communicatively coupled together via a bus 1410. The electronic device 1400 may be referred to herein as a "computing device."

The processing circuitry 1420, may be included in, may include, and/or may be implemented by one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 (e.g., "computing device") may include a semiconductor device according to any of the example embodiments, a semiconductor interconnect according to any of the example embodiments, and/or an electrode for a semiconductor device according to any of the example embodiments, in one or more of the processing circuitry 1420 or the memory 1430. For example, the electronic device 1400 may include, in any portion thereof, a semiconductor device that is a transistor, such as a metal-oxide-semiconductor field effect transistor (MOSFET), that includes the multielement compound thin film, semiconductor interconnect, and/or electrode for a semiconductor device according to any of the example embodiments.

Referring now to FIG. 9, a system 1500 may include system 1301, which is configured to form a multielement compound thin film, semiconductor interconnect, electrode for a semiconductor device, and/or semiconductor device according to any of the example embodiments of the inventive concepts, including preparing a multielement compound thin film according to the method shown in FIG. 6 (e.g., S702-S706).

Referring to FIGS. 6 and 9, in some example embodiments, the method may include, with or without forming the barrier layer at S706, incorporating the multielement compound thin film in a semiconductor interconnect or an electrode and thereby manufacturing the semiconductor interconnect or electrode (S708). Said method may be performed by system 1301 and/or 1500.

Referring to FIGS. 6 and 9, in some example embodiments, the method may include, with or without manufacturing a semiconductor interconnect or electrode at S708, manufacturing a semiconductor device that includes the multielement compound thin film (S710). The manufacturing at S710 may include coupling the semiconductor interconnect or electrode that is manufactured at S708 to one or more structures of the semiconductor device (e.g., semiconductor device component 1020, semiconductor device component 1030, etc.), incorporating the multielement compound thin film formed at S704 or S706 into the semiconductor device, or the like. Said method may be performed by system 1301 and/or 1500.

Referring to FIGS. 6, 8, and 9, in some example embodiments, the method may include, with or without manufacturing a semiconductor device at S710, manufacturing an electronic device (e.g., electronic device 1400) that includes the multielement compound thin film (S712). The manufacturing at S712 may include incorporating the multielement compound thin film, semiconductor interconnect, electrode for a semiconductor device, and/or semiconductor device into a separate electronic device (e.g., "computing device", such as electronic device 1400). For example, a device 4000 formed based on system 1301 implementing at least some of S702-S710 may be a device that is configured to be incorporated into an electronic device that is a computing device (e.g., electronic device 1400 as shown in FIG. 8). Referring to FIG. 9, system 1500 further includes a fabrication assembly 1504 that is configured to incorporate the device(s) formed by system 1301 (e.g., device 4000, which may be the multielement compound thin film, semiconductor interconnect, electrode for a semiconductor device, and/or semiconductor device) with various electronic device (e.g., "computing device") sub-components 1502 (where the sub-components 1502 may include printed circuit boards, power supplies, buses, communication interface components, processing circuitry components, memory components, any combination thereof, or the like). The fabrication assembly 1504 may incorporate the device(s) 4000 that are sub-device(s) with the sub-components 1502 (e.g., as part of S712 in FIG. 6), to fabricate ("manufacture") electronic device (e.g., "computing device") components (e.g., processing circuitries 1420, memories 1430, any combination thereof, or the like) and/or electronic devices (e.g., "computing device") themselves, to manufacture ("fabricate") separate electronic device(s) 1400 (e.g., "computing devices") that include one or more devices (e.g., the multielement compound thin film, semiconductor interconnect, electrode for a semiconductor device, and/or semiconductor device) according to any example embodiments of the inventive concepts. Such incorporation and manufacturing be part of S712 and may include, for example, assembling an electronic device (e.g., "computing device") component (e.g., processing circuitry 1420 and/or memory 1430 based on incorporating said electronic devices to additional electronic device sub-components, etc.) based on coupling the device(s) 4000 to one or more electronic device sub-components and coupling the electronic device component to other electronic device components (e.g., printed circuit board, or PCB) to manufacture the electronic device (e.g., 1400).

Hereinafter, the present inventive concepts will be described in more detail with reference to examples and comparative examples. However, the scope of the present inventive concepts are not limited to the following examples.

EXAMPLES

Example 1: Preparation of $V_2AlC$ Thin Film

Single-crystal $Al_2O_3^{(11\bar{2}0)}$ was prepared as a substrate. A V—Al—C metallurgical composite powder having a stoichiometric atomic ratio of 2:1:1 was synthesized as a target (diameter: 2 inch) of DC sputtering. The synthesized metallurgical composite powder was used for epitaxial growth on one surface of the substrate by DC sputtering at a temperature of 800° C. to form a $V_2AlC$ thin film. The DC sputtering was performed at a fixed pressure of 5 mTorr by introducing Ar gas (99.9999%) while maintaining a base pressure of less than $3 \times 10^{-7}$ torr. A power applied to the DC sputtering was 150 W. An undoped Si thin film (about 3 nm) barrier layer was formed on the $V_2AlC$ thin film by RF sputtering.

Comparative Example 1: Preparation of Cu Thin Film

A glass substrate was prepared as a substrate. A Cu thin film was formed on a glass substrate by thermal deposition in a vacuum chamber at a pressure of 10-3 Pa and a growth rate of about 0.2 nm/s.

Comparative Example 2: Preparation of $V_2AlC$ Thin Film

Single-crystal $Al_2O_3^{(11\bar{2}0)}$ was prepared as a substrate. A V—Al—C metallurgical composite powder having a stoichiometric atomic ratio of 2:1:1 was synthesized as a target (diameter: 2 inch) of DC sputtering. The synthesized metallurgical composite powder was used for epitaxial growth on one surface of the substrate by DC sputtering at a temperature of 640° C. to form a $V_2AlC$ thin film. The DC sputtering was performed at a fixed pressure of 5 mTorr by introducing Ar gas (99.9999%) while maintaining a base pressure of less than $3 \times 10^{-7}$ torr. A power applied to the DC sputtering was 150 W. An undoped Si thin film (about 3 nm) barrier layer was formed on the $V_2AlC$ thin film by RF sputtering.

Analysis Example 1: XRD Analysis

The $V_2AlC$ thin film according to Example 1 prepared to have thicknesses of 6 nm, 11 nm, 23 nm, and 35 nm was analyzed by X-ray diffraction (XRD). The results are shown in FIG. 1. XRD analysis was performed by an X'PERT-PRO MRD device (manufactured by Malvern Panalytical) and Cu-$K_\beta$ rays.

As shown in FIG. 1, the $V_2AlC$ thin film prepared in Example 1 exhibited peaks at diffraction angles (2Θ) of 13.6°, 27.3°, and 41.3°, respectively derived from $V_2AlC$ (0002), $V_2AlC$ (0004), and $V_2AlC$ (0006) planes. In addition, a peak derived from the $Al_2O_3^{(11\bar{2}0)}$ substrate at a diffraction angle (2Θ) of about 38°. Based thereon, it was confirmed that the $V_2AlC$ thin film prepared in Example 1 has a structure epitaxially grown on one surface of the $Al_2O_3^{(11\bar{2}0)}$ substrate.

Analysis Example 2: FE-SEM Image

The $V_2AlC$ thin film according to Example 1 prepared to have thicknesses of 6 nm, 11 nm, 23 nm, 35 nm, and 42 nm and the $V_2AlC$ thin film according to Comparative Example 2 having a thickness of 42 nm were analyzed using FE-SEM (FEI; NOVA NanoSEM 450). The results are shown in FIGS. 2A to 2D and FIG. 2E, respectively.

Figure 2A:
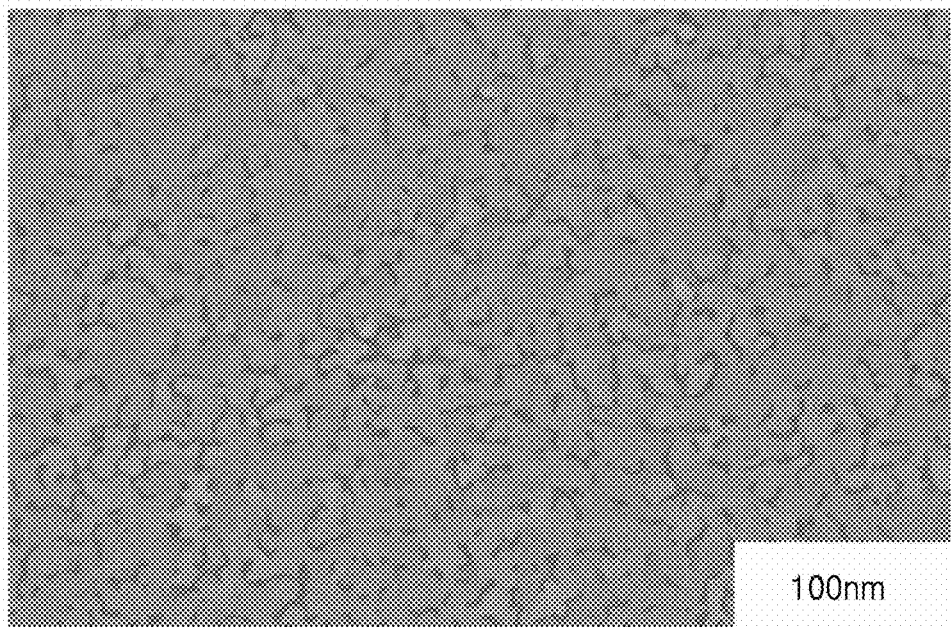
FIGS. 2A, 2B, 2C, and 2D are FE-SEM images of a $V_2AlC$ thin film according to Example 1 prepared to have thicknesses of 6 nm, 11 nm, 23 nm, and 35 nm according to some example embodiments.
Figure 2B:
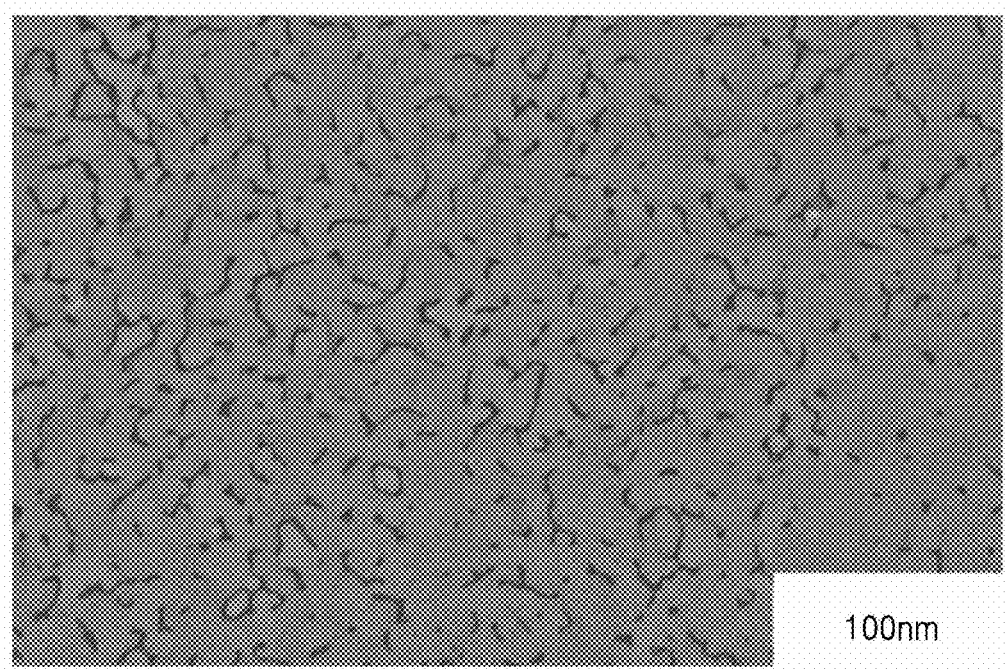
Figure 2C:
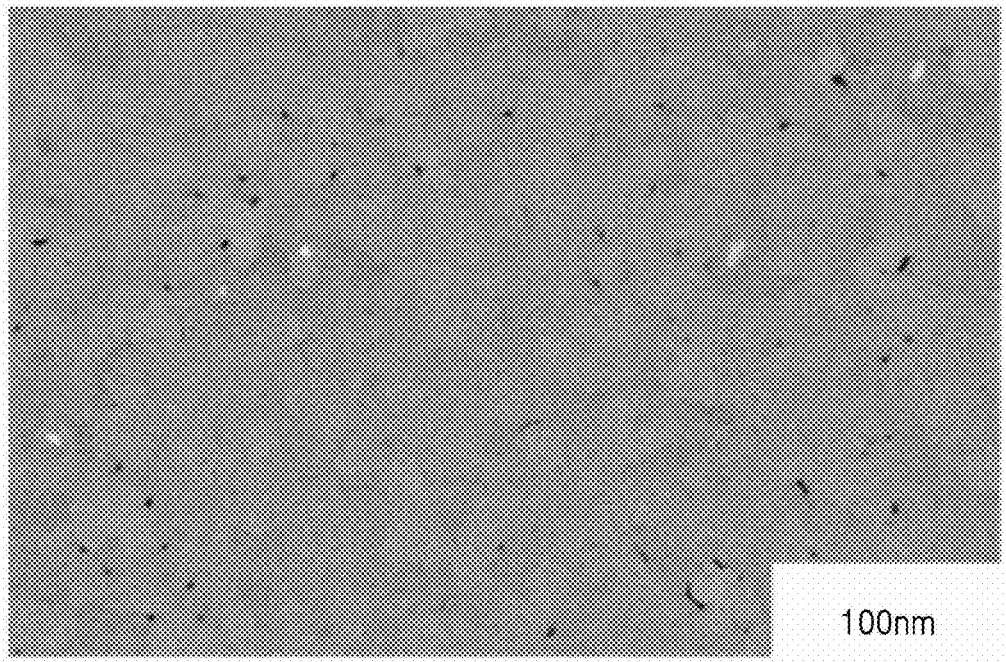
Figure 2D:
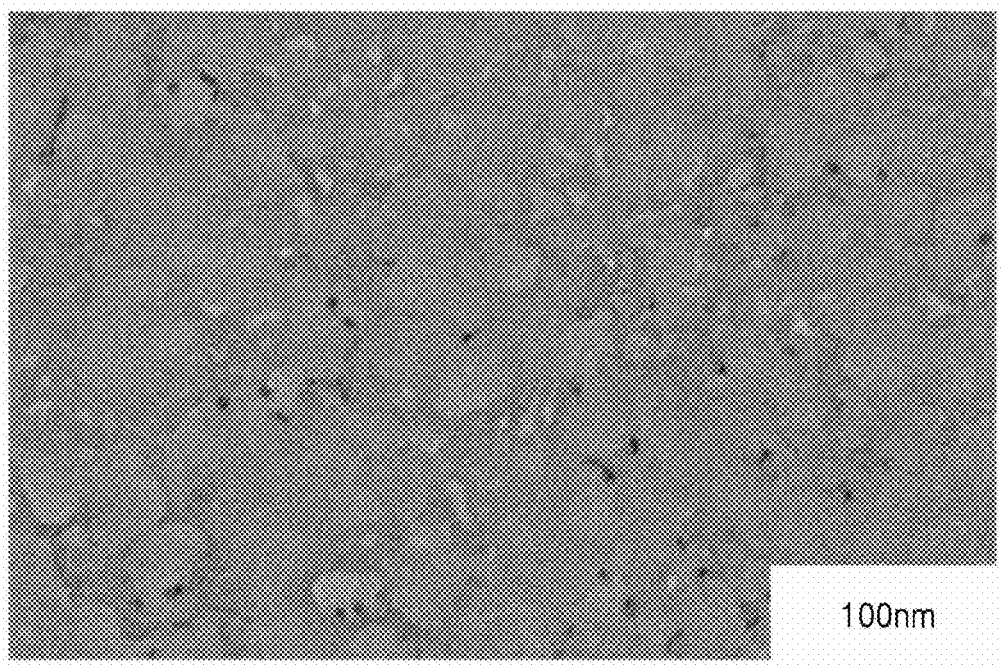
Figure 2E:
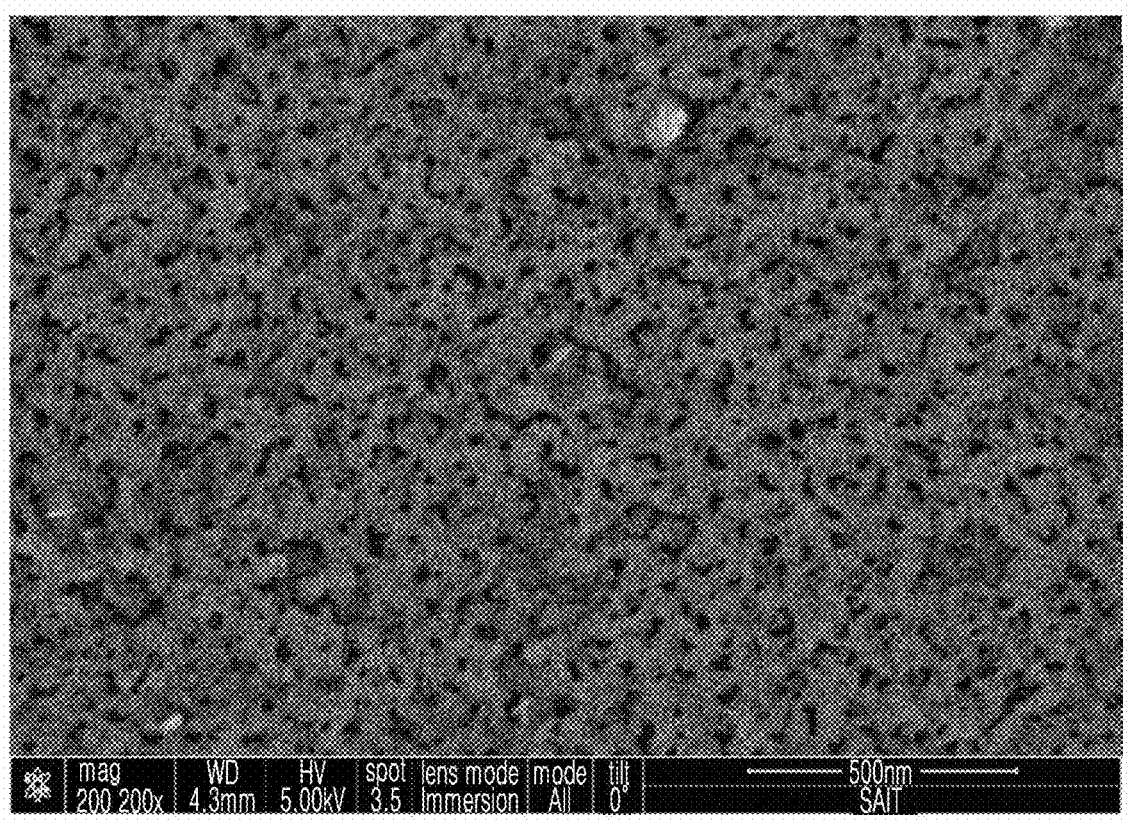
FIG. 2E shows FE-SEM images of a $V_2AlC$ thin film according to Comparative Example 2 prepared to have a thickness of 42 nm according to some example embodiments.

As shown in FIGS. 2A to 2D, the $V_2AlC$ thin film according to Example 1 exhibited uniform and continuous thin film shapes in most cases. Large grains having hexagonal disk shapes were observed but grains having cubic shapes were not observed. Grain sizes of the $V_2AlC$ thin films according to Example 1 respectively having thicknesses of 6 nm, 11 nm, 23 nm, and 35 nm were observed as 67 nm, 83 nm, 109 nm, and 141 nm, respectively. As shown in FIG. 2E, small grains having a size of 50 nm were observed in the $V_2AlC$ thin film according to Comparative Example 2 having a thickness of 42 nm.

Analysis Example 3: HR-TEM Analysis

A $V_2AlC$ thin film according to Example 1 prepared to have a thickness of 9.5 nm was analyzed using HR-TEM (JEOL, JEM-2100F). The results are shown in FIG. 3.

Figure 3:
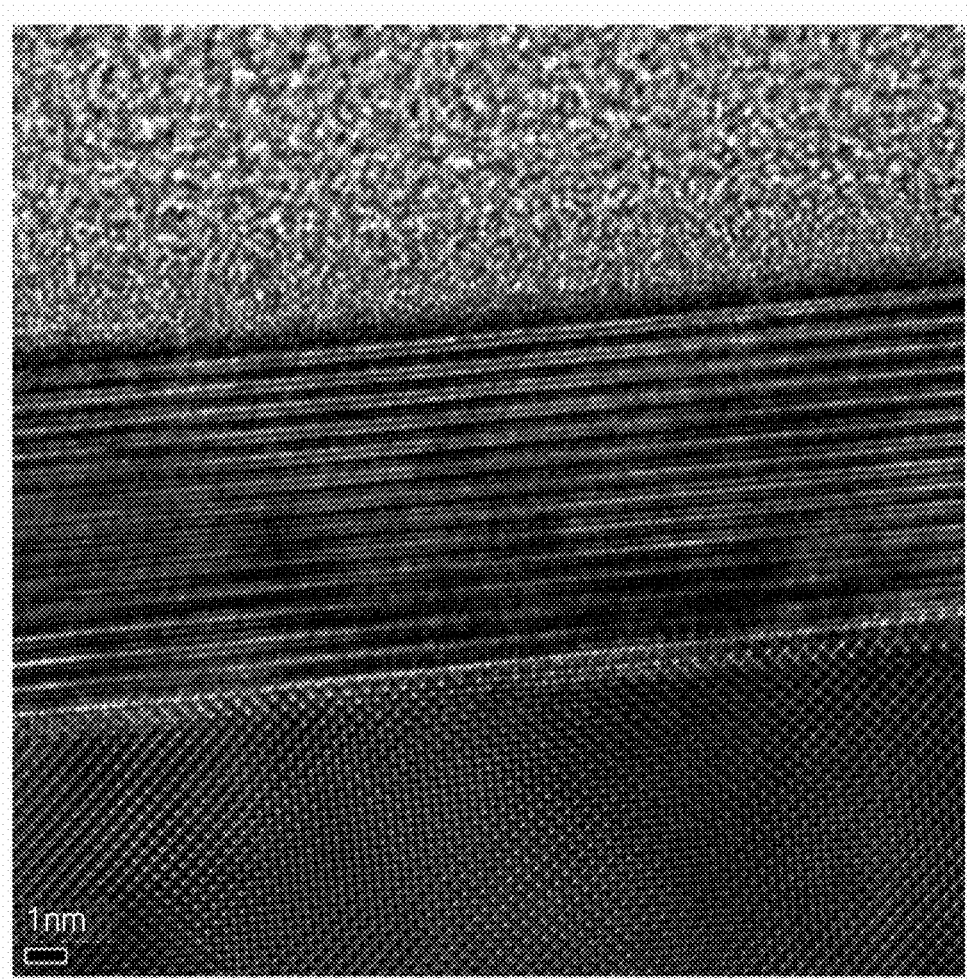
FIG. 3 shows HR-TEM analysis results of a $V_2AlC$ thin film according to Example 1 prepared to have a thickness of 9.5 nm according to some example embodiments.

As shown in FIG. 3, a $V_2AlC$ thin film according to Example 1 having a thickness of 9.5 nm grown on the $Al_2O_3$ substrate with a crystal axis of 2 was observed. An Si capping layer (e.g., barrier layer) having a thickness of about 3 nm was additionally observed on the $V_2AlC$ thin film. It was confirmed that the $V_2AlC$ thin film prepared according to Examples 1 was grown epitaxially on the $Al_2O_3^{(11\overline{2}0)}$ substrate.

Evaluation Example 1: Evaluation of Resistivity

Figure 4:
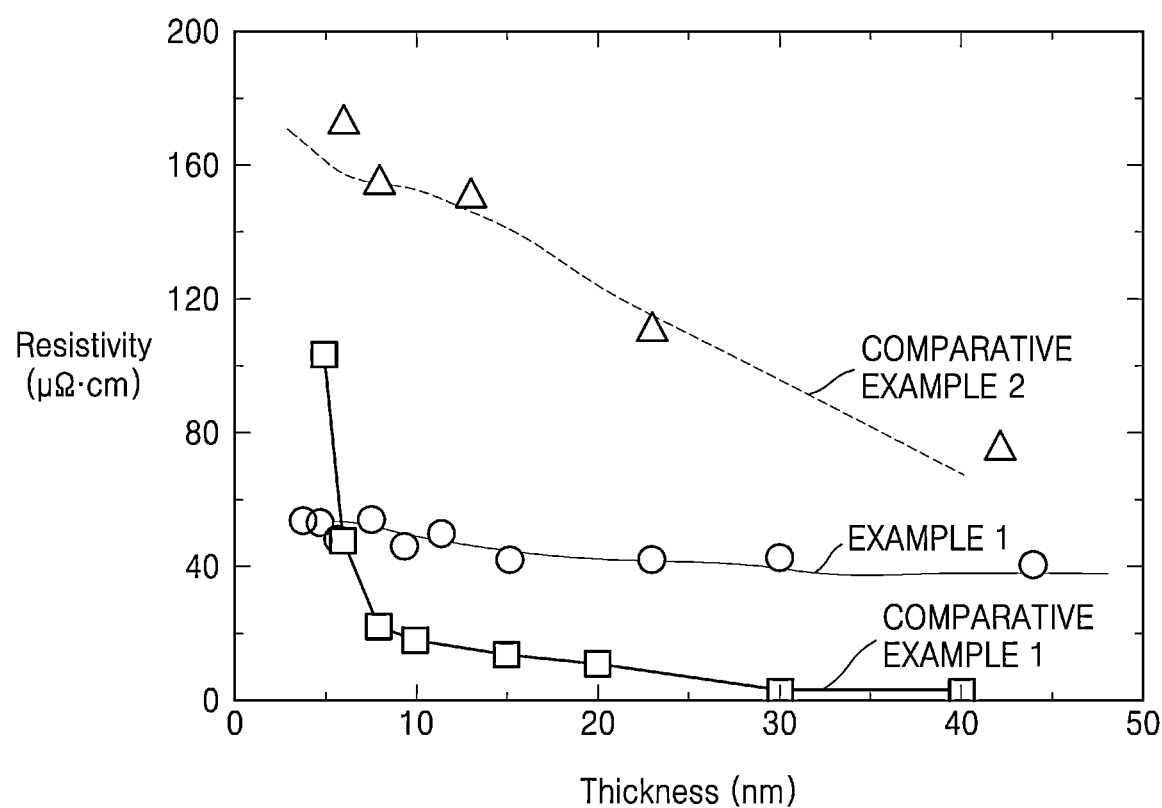
FIG. 4 is a graph illustrating results of evaluating resistivity of a $V_2AlC$ thin film according to Example 1, a Cu thin film according to Comparative Example 1, and a $V_2AlC$ thin film according to Comparative Example 2, each having a thickness of 1 nm to 50 nm according to some example embodiments.

Resistivity of the $V_2AlC$ thin film according to Example 1, the Cu thin film according to Comparative Example 1, and the $V_2AlC$ thin film according to Comparative Example 2, each having a thickness of 1 nm to 50 nm, was evaluated. The results are shown in FIG. 4. Evaluation of resistivity with respect to thickness was performed using a four-point probe system (Advanced Instrument Technology, CMT-SR2000N).

As shown in FIG. 4, as the thickness decreases from 50 nm to 1 nm, the resistivity of the $V_2AlC$ thin film prepared according to Example 1 slightly increased by a negligible level. The $V_2AlC$ thin film, which was according to Example 1 prepared to have a thickness of 6 nm, had a low resistivity of 49 $\mu\Omega\cdot cm$, which is almost the same as the resistivity of the $V_2AlC$ thin film having a thickness of 50 nm. In comparison therewith, the resistivity of the Cu thin film prepared according to Comparative Example 1 significantly increased up to about 18 times as the thickness decreased from 50 nm to 1 nm. The resistivity of the $V_2AlC$ thin film prepared according to Comparative Example 2 increased in proportion to the thickness as the thickness decreased from 40 nm to 5 nm.

Resistivity of the $V_2AlC$ thin film according to Example 1 and the $V_2AlC$ thin film according to Comparative Example 2, each having a thickness of 25 nm, was evaluated. The results are shown in Table 1.

TABLE 1

|  | Example 1 | Comparative Example 2 |
|---|---|---|
| Grain size (nm) | 109 | 21 |
| Resistivity ($\mu\Omega\cdot cm$) | 42 | 111 |
| Grain size/thickness (A/B) | 4.7 | 0.8 |

Referring to Table 1, at the same thickness of 25 nm, the $V_2AlC$ thin film according to Example 1 had a 5.2 times greater grain size and a 2.6 times lower resistivity than the $V_2AlC$ thin film according to Comparative Example 2. The $V_2AlC$ thin film according to Example 1 had a grain size (A) to thickness (B) ratio (A/B) of 4.7, which was greater than that of the $V_2AlC$ thin film according to Comparative Example 2.

The semiconductor interconnect or the electrode for semiconductor devices according to some example embodiments of the present inventive concepts may achieve a low resistivity by including the thin film including a multielement compound and having a thickness of 50 nm or less and a grain size (A) to thickness (B) ratio (A/B) of 1.2 or more. According to the method of preparing a multielement compound thin film according to some example embodiments of the present inventive concepts, a multielement compound thin film having excellent interconnecting reliability and a low resistivity may be prepared, and thus a semiconductor device and/or electronic device including the multielement compound thin film according to some example embodiments of the present inventive concepts may have improved reliability.

It should be understood that some example embodiments described herein should be considered in a descriptive sense only and not for purposes of limitation. Descriptions of features or aspects within some example embodiments should typically be considered as available for other similar features or aspects in some other example embodiments. While some example embodiments have been described with reference to the figures, it will be understood by those of ordinary skill in the art that various changes in form and details may be made therein without departing from the spirit and scope as defined by the following claims.

What is claimed is:

1. A semiconductor interconnect, comprising:
   a thin film that includes a multielement compound represented by Formula 1, wherein the thin film has a thickness equal to or less than about 50 nm, a grain size equal to or greater than the thickness, and a resistivity equal to or less than about 200 $\mu\Omega\cdot cm$, $$M_{n+1}AX_n \qquad \text{Formula 1}$$

wherein in Formula 1,
   M includes at least one transition metal selected from elements of periodic table groups 3, 4, 5, and 6,
   A includes at least one element selected from elements of periodic table groups 12, 13, 14, 15, and 16,
   X is carbon (C), nitrogen (N), or any combination thereof, and
   n is 1, 2, or 3.

2. The semiconductor interconnect of claim 1, wherein the grain size is equal to or greater than about 65 nm.

3. The semiconductor interconnect of claim 1, wherein the thickness is in a range of about 0.1 nm to about 50 nm.

4. The semiconductor interconnect of claim 1, wherein the multielement compound comprises at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$.

5. The semiconductor interconnect of claim 1, wherein the thin film is an epitaxially grown deposited film.

6. The semiconductor interconnect of claim 1, wherein the thin film has a layered structure aligned in an in-plane direction.

7. The semiconductor interconnect of claim 1, further comprising a seed layer or liner layer on one surface of the thin film.

8. The semiconductor interconnect of claim 7, wherein the seed layer or liner layer comprises TiC, TiN, TaC, TaN, VC, VN, or any combination thereof.

9. An electrode for a semiconductor device, the electrode comprising:
  a thin film including a multielement compound represented by Formula 1, wherein the thin film has a thickness equal to or less than about 50 nm, a grain size equal to or greater than the thickness, and a resistivity equal to or less than about 200 μΩ·cm:

$$M_{n+1}AX_n \quad \text{Formula 1}$$

wherein in Formula 1,
    M includes at least one transition metal selected from elements of periodic table groups 3, 4, 5, and 6,
    A comprises at least one element selected from elements of periodic table groups 12, 13, 14, 15, and 16,
    X is carbon (C), nitrogen (N), or any combination thereof, and
    n is 1, 2, or 3.

10. The electrode of claim 9, wherein the grain size is equal to or greater than about 65 nm.

11. The electrode of claim 9, wherein the thickness is in a range of about 0.1 nm to about 50 nm.

12. The electrode of claim 9, wherein the thin film comprises at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$.

13. The electrode of claim 9, wherein the thin film is an epitaxially grown deposited film.

14. The electrode of claim 9, wherein the thin film has a layered structure aligned in an in-plane direction.

15. The electrode of claim 9, further comprising:
  a capacitor electrode or a transistor electrode.

16. A method, the method comprising:
  preparing a substrate; and
  forming a multielement compound thin film represented by Formula 1 and epitaxially grown on one surface of the substrate by deposition, wherein the multielement compound thin film has a thickness equal to or less than about 50 nm, a grain size equal to or greater than the thickness, and a resistivity equal to or less than about 200 μΩ·cm:

$$M_{n+1}AX_n \quad \text{Formula 1}$$

wherein in Formula 1,
    M includes at least one transition metal selected from elements of periodic table groups 3, 4, 5, and 6,
    A comprises at least one element selected from elements of periodic table groups 12, 13, 14, 15, and 16,
    X is carbon (C), nitrogen (N), or any combination thereof, and
    n is 1, 2, or 3.

17. The method of claim 16, wherein the deposition comprises direct current (DC) sputtering, radio frequency (RF) sputtering, or any combination thereof.

18. The method of claim 16, wherein the deposition is performed at a temperature of about 650° C. to about 800° C.

19. The method of claim 16, wherein the grain size-A is equal to or greater than about 65 nm.

20. The method of claim 16, wherein the multielement compound thin film comprises at least one compound selected from $V_2AlC$, $V_2GaC$, $V_2GeC$, $V_2AsC$, $V_2GaN$, $V_2PC$, $V_3AlC_2$, $V_4AlC_3$, $Ti_2CdC$, $Ti_2AlC$, $Ti_2GaC$, $Ti_2InC$, $Ti_2TlC$, $Ti_2AlN$, $Ti_2GaN$, $Ti_2InN$, $Ti_2GeC$, $Ti_2SnC$, $Ti_2PbC$, $Ti_2SC$, $Ti_3AlC_2$, $Ti_3SiC_2$, $Ti_3GeC_2$, $Ti_3SnC_2$, $Ti_4AlN_3$, $Ti_4GaC_3$, $Ti_4SiC_3$, $Ti_4GeC_3$, $Cr_2GaC$, $Cr_2GaN$, $Cr_2AlC$, $Cr_2GeC$, $Zr_2InC$, $Zr_2TlC$, $Zr_2InN$, $Zr_2TlN$, $Zr_2SnC$, $Zr_2PbC$, $Zr_2SC$, $Nb_2AlC$, $Nb_2GaC$, $Nb_2InC$, $Nb_2SnC$, $Nb_2PC$, $Nb_2AsC$, $Nb_2SC$, $Nb_4AlC_3$, $Ta_2AlC$, $Ta_2GaC$, $Ta_3AlC_2$, $Ta_4AlC_3$, $Hf_2InC$, $Hf_2TlC$, $Hf_2SnC$, $Hf_2PbC$, $Hf_2SnN$, $Hf_2SC$, $Sc_2InC$, and $Mo_2GaC$.

21. The method of claim 16, wherein the multielement compound thin film has a layered structure aligned in an in-plane direction.

22. The method of claim 16, further comprising incorporating the multielement compound thin film in a semiconductor interconnect or an electrode for semiconductor devices.

23. The method of claim 16, further comprising forming a barrier layer on the multielement compound thin film after the forming of the multielement compound thin film.

24. The method of claim 16, further comprising:
  forming an electronic device that includes the multielement compound thin film.

25. An electronic device, comprising the semiconductor interconnect of claim 1.

26. An electronic device, comprising the electrode of claim 9.

27. A device, comprising:
  a thin film that includes a multielement compound represented by Formula 1, wherein the thin film has a thickness between about 6 nm and about 42 nm, a grain size equal to or greater than the thickness, and a resistivity between about 40 μΩ·cm to about 50 μΩ·cm, $$M_{n+1}AX_n \quad \text{Formula 1}$$

wherein in Formula 1,
    M includes at least one transition metal selected from elements of periodic table groups 3, 4, 5, and 6,
    A includes at least one element selected from elements of periodic table groups 12, 13, 14, 15, and 16,
    X is carbon (C), nitrogen (N), or any combination thereof, and
    n is 1, 2, or 3.

28. The device of claim 27, wherein the thin film has a grain size to thickness (B) ratio (A/B) equal to or greater than about 1.2.

29. The device of claim 27, wherein the device is a semiconductor interconnect or an electrode for a semiconductor device.

30. An electronic device, comprising the device of claim 27.

* * * * *